(12) United States Patent
Kasai et al.

(10) Patent No.: US 8,928,101 B2
(45) Date of Patent: Jan. 6, 2015

(54) SEMICONDUCTOR DEVICE

(75) Inventors: Hiroki Kasai, Miyagi (JP); Yasuo Arai, Ibaraki (JP); Takaki Hatsui, Hyogo (JP)

(73) Assignees: LAPIS Semiconductor Co., Ltd., Yokohama (JP); RIKEN, Saitama (JP)

( * ) Notice: Subject to any disclaimer, the term of this patent is extended or adjusted under 35 U.S.C. 154(b) by 0 days.

(21) Appl. No.: 13/253,791

(22) Filed: Oct. 5, 2011

(65) Prior Publication Data
US 2012/0086079 A1  Apr. 12, 2012

(30) Foreign Application Priority Data

Oct. 6, 2010 (JP) .................................. 2010-226717

(51) Int. Cl.
*H01L 31/0224* (2006.01)
*H01L 27/146* (2006.01)
*H01L 27/12* (2006.01)

(52) U.S. Cl.
CPC ....... *H01L 27/14607* (2013.01); *H01L 27/1203* (2013.01); *H01L 27/14659* (2013.01)
USPC ........... 257/431; 257/428; 257/429; 257/430; 257/E31.11

(58) Field of Classification Search
CPC ............ H01L 27/1207; H01L 29/8611; H01L 27/14607; H01L 27/14659
USPC ............ 257/21, 428–431, 457, 292, E31.086, 257/E31.087, E31.11; 438/56, 57; 250/370.9, 370.14; 378/48, 90
See application file for complete search history.

(56) References Cited

U.S. PATENT DOCUMENTS 6,025,585 A     2/2000  Holland
6,421,414 B1 *  7/2002  Huber ............................. 378/45
7,105,827 B2 *  9/2006  Lechner et al. .......... 250/370.01
(Continued)

FOREIGN PATENT DOCUMENTS

JP   H08-288524 A    11/1996
JP   H09-74187 A      3/1997
(Continued)

OTHER PUBLICATIONS

Siegfried Pahlke, "Quo Vadis total reflection X-ray fluorescence?", (2003), Spectrochimica Acta Part B 58 (2003) 2025-2038.*
(Continued)

Primary Examiner — Stephen W Smoot
Assistant Examiner — Pavel Ivanov
(74) Attorney, Agent, or Firm — Studebaker & Brackett PC

(57) ABSTRACT

A semiconductor device includes: a first semiconductor layer of a first conductivity type; an insulation layer on the first semiconductor layer; a second semiconductor layer in the insulation layer; an active element in the second semiconductor layer; a first semiconductor region on the first semiconductor layer and of a second conductivity type; a second semiconductor region in the first semiconductor region and of the second conductivity type with a higher impurity concentration than the first semiconductor region; a first conductor in a through hole in the insulation layer and connected to the second semiconductor region; a second conductor above or within the insulation layer, the second conductor surrounding the first conductor such that an outside edge thereof is outside the second semiconductor region; a third conductor connecting the first and second conductors; and a fourth conductor connected to the first semiconductor layer.

5 Claims, 11 Drawing Sheets

(56) References Cited

U.S. PATENT DOCUMENTS

| | | | |
|---|---|---|---|
| 7,315,025 B2* | 1/2008 | Yokoi et al. | 250/336.2 |
| 2002/0139970 A1* | 10/2002 | Iwanczyk et al. | 257/21 |
| 2003/0025551 A1* | 2/2003 | Kobayashi et al. | 327/540 |
| 2003/0127599 A1 | 7/2003 | Numai et al. | |
| 2003/0155517 A1 | 8/2003 | Numai et al. | |
| 2007/0072332 A1* | 3/2007 | Kemmer | 438/56 |
| 2009/0026569 A1* | 1/2009 | Dongliang et al. | 257/465 |
| 2010/0163742 A1* | 7/2010 | Watanabe et al. | 250/370.15 |

FOREIGN PATENT DOCUMENTS

| | | |
|---|---|---|
| JP | H10-56187 A | 2/1998 |
| JP | 2000-124492 A | 4/2000 |
| JP | 2000-277718 A | 10/2000 |
| JP | 2001-503918 A | 3/2001 |
| JP | 2001-291853 A | 10/2001 |
| JP | 2001-313412 A | 11/2001 |
| JP | 2002-124657 A | 4/2002 |
| JP | 2002-217444 A | 8/2002 |
| JP | 2003-168794 A | 6/2003 |
| JP | 2003-240861 A | 8/2003 |
| JP | 2007-250862 A | 9/2007 |
| JP | 2009-158528 A | 7/2009 |

OTHER PUBLICATIONS

Umesh K. Mishra and Jasprit Singh, Semiconductor Device Physics and Design, 2008, Springer, 229-230.*

An Office Action; "Notice of Reasons for Rejection," issued by the Japanese Patent Office on Jul. 1, 2014, which corresponds to Japanese Patent Application No. 2010-226717 and is related to U.S. Appl. No. 13/253,791; with English language translation.

* cited by examiner

PRIOR ART

US 8,928,101 B2

SEMICONDUCTOR DEVICE

CROSS-REFERENCE TO RELATED APPLICATION

This application claims priority under 35 USC 119 from Japanese Patent Application No. 2010-226717 filed on Oct. 6, 2010, the disclosure of which is incorporated by reference herein.

BACKGROUND

1. Field of the Invention

The present invention relates to a semiconductor device, and in particular to an X-ray sensor with both a diode and a transistor present on the same Silicon On Insulator (SOI) substrate.

2. Related Art

For a sensor of SOI construction, there is a proposal for a CMOS imaging sensor including, on a an Silicon On Insulator (SOI) substrate, a photodiode and a amplification transistor for amplifying a signal from charge photoelectric converted using a silicon substrate and accumulated in the diode (see Japanese Patent Application Laid-Open (JP-A) No. 2002-124657).

In an X-ray sensor, methods employed to raise detection sensitivity during X-ray irradiation include employing a low impurity concentration and high resistance substrate and applying a bias of several hundred volts to the back face of the substrate in order to deplete the entire substrate. FIG. 17 is a schematic vertical cross-section for explaining a conventional X-ray sensor 9. In a conventional device, generally, when depleting an N-type substrate 100, a high impurity concentration P-type diffusion layer 114, serving as the anode of the diode configured in the low impurity concentration N-type substrate 100, is connected to earth 180, a high impurity concentration N-type diffusion layer 102 serving as the cathode of the diode and an electrode 120 on the back face of the N-type substrate 100 are connected to a anode 172 of the power source 170. A reverse voltage is then applied to the diode. In order to relax the electrical field when this is performed in the depletion layer spreading out to the anode electrode high impurity concentration P-type diffusion layer 114 side, a low impurity concentration P-well diffusion layer 112 is formed so as to cover the high impurity concentration P-type diffusion layer 114, thereby raising the reverse voltage withstanding ability of the diode.

However, there is a limit to the electric field relaxing effect obtained by the P-well diffusion layer 112 and breakdown occurs when the depletion layer spreading out to the low impurity concentration P-well diffusion layer 112 side reaches the high impurity concentration P-type diffusion layer 114 when voltage is applied to PN junction, due to the intense electric field occurring at the edge of the high impurity concentration P-type diffusion layer 114. The large potential difference within the P-well diffusion layer 112 also causes problems from the perspective of withstand voltage.

SUMMARY

The present invention is mainly directed towards providing a semiconductor device with raised reverse voltage withstanding capability.

According to a first aspect of the present invention, there is provided a semiconductor device comprising:

a first semiconductor layer of a first conductivity type;

an insulation layer provided on a first main face of the first semiconductor layer;

a second semiconductor layer provided in the insulation layer;

an active element provided in the second semiconductor layer;

a first semiconductor region provided on the first main face of the first semiconductor layer and having a second conductivity type opposite to the first conductivity type;

a second semiconductor region provided in the first semiconductor region and having the second conductivity type with a higher concentration of impurities than the first semiconductor region;

a first conductor provided in a through hole provided in the insulation layer and connected to the second semiconductor region;

a second conductor provided either above the insulation layer or within the insulation layer, the second conductor being provided so as to surround the first conductor such that an outside edge portion of the second conductor is disposed further outside than the second semiconductor region when viewed from a direction perpendicular to the first main face;

a third conductor provided so as to connect together the first conductor and the second conductor; and a fourth conductor provided so as to be electrically connected to the first semiconductor layer.

According to a second aspect of the present invention, there is provided a semiconductor device comprising:

a first semiconductor layer of a first conductivity type;

an insulation layer provided on a first main face of the first semiconductor layer;

a first semiconductor region provided on the first main face of the first semiconductor layer and having a second conductivity type opposite to the first conductivity type;

a second semiconductor region provided in the first semiconductor region and having the second conducting type with a higher concentration of impurities than the first semiconductor region;

a first conductor provided in a through hole provided in the insulation layer and connected to the second semiconductor region;

a second conductor provided either above the insulation layer or within the insulation layer, the second conductor being provided so as to surround the first conductor such that an outside edge portion of the second conductor is disposed further outside than the second semiconductor region when viewed from a direction perpendicular to the first main face;

a third conductor provided so as to connect together the first conductor and the second conductor; and a fourth conductor provided so as to be electrically connected to the first semiconductor layer.

BRIEF DESCRIPTION OF THE DRAWINGS

Exemplary embodiments of the present invention will be described in detail based on the following figures, wherein.

DETAILED DESCRIPTION

Explanation follows regarding preferred exemplary embodiments of the present invention, with reference to the drawings.

First Exemplary Embodiment

Figure 1:
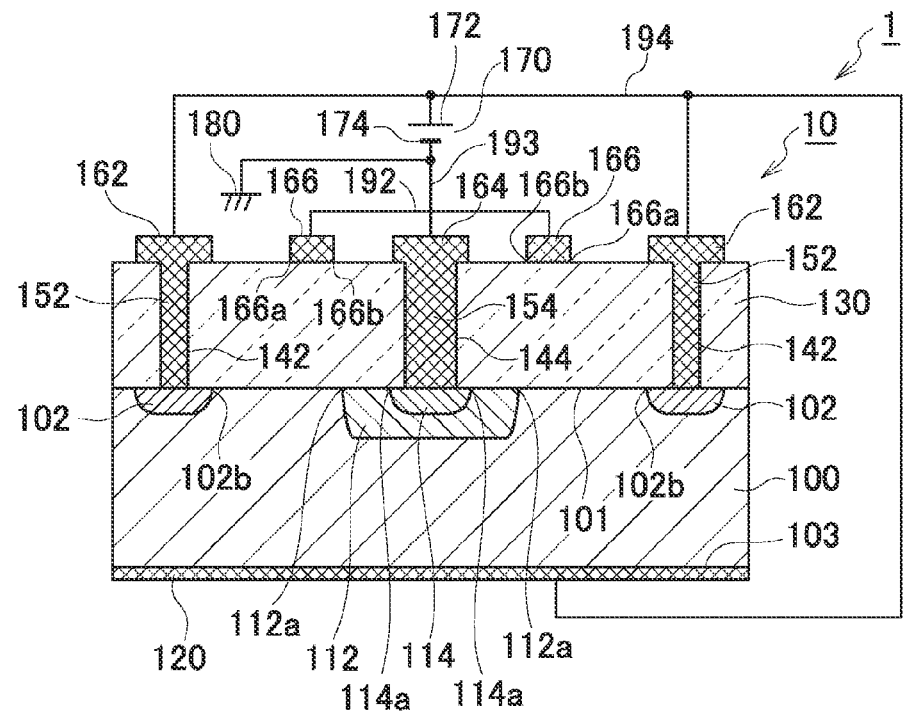
FIG. 1 is a schematic vertical cross-section for explaining an X-ray sensor of a first exemplary embodiment of the present invention.
Figure 2:
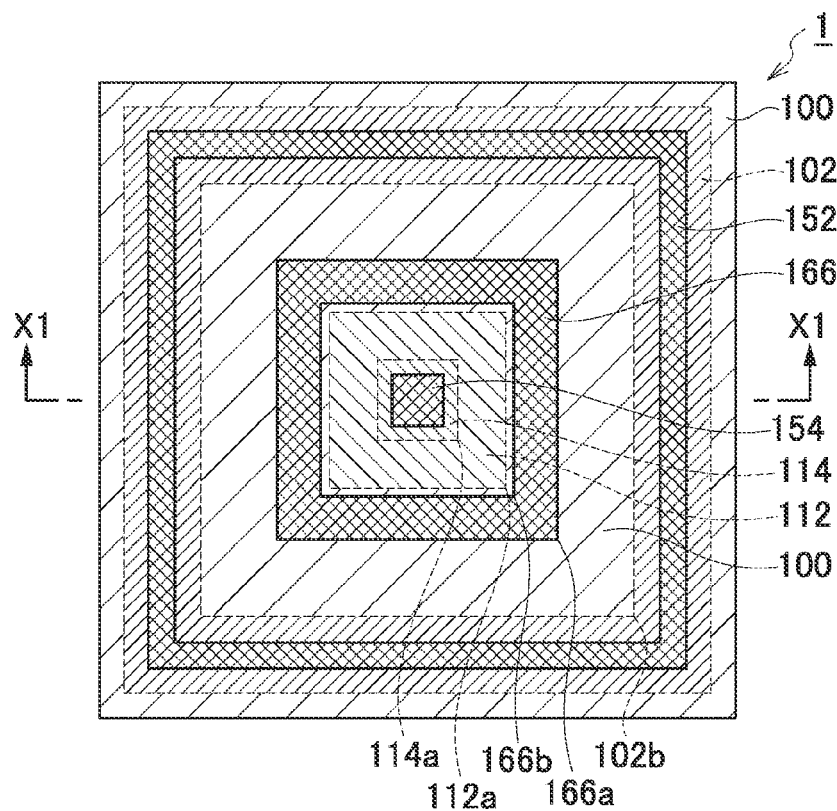
FIG. 2 is a plan view of FIG. 1.

FIG. 1 is a schematic vertical cross-section for explaining an X-ray sensor of a first exemplary embodiment of the present invention. FIG. 2 is a plan view of FIG. 1, with conductors 162, 164 and insulator layer 130 omitted for clarity. FIG. 1 is a schematic vertical cross-section taken on line X1-X1 of FIG. 2.

As shown by reference to FIG. 1 and FIG. 2, an X-ray sensor 1 of the first exemplary embodiment of the present invention is configured with: a N-type substrate 100; a P-well diffusion layer 112 provided on a first main face 101 of the N-type substrate 100; a high impurity concentration P-type diffusion layer 114 provided within the P-well diffusion layer 112; a high impurity concentration N-type diffusion layer 102 provided on the first main face 101 of the N-type substrate 100; an electrode 120 provided on a back face 103 on the opposite side of the N-type substrate 100 to the first main face 101; an insulating layer 130 provided on the first main face 101 of the N-type substrate 100; through holes 142, 144 provided in the insulating layer 130; a buried conductor 152 filled in the through hole 142 and provided connected to the high impurity concentration N-type diffusion layer 102; a buried conductor 154 provided connected to the high impurity concentration P-type diffusion layer 114; a conductor 162 provided on the insulating layer 130 and connected to the buried conductor 152; a conductor 164 provided on the insulating layer 130 and connected to the buried conductor 154; a conductor 166 provided on the insulating layer 130 around the periphery of the buried conductor 154; and a conductor 192 provided so as to connect together the conductor 164 and the conductor 166.

Explanation follows regarding the layout of each configuration portion as seen when viewed from a direction perpendicular to the first main face 101 of the N-type substrate 100, with reference to FIG. 2. The buried conductor 154 is provided in a square shape disposed inside the high impurity concentration P-type diffusion layer 114. The high impurity concentration P-type diffusion layer 114 is provided in a square shape disposed inside the P-well diffusion layer 112. The P-well diffusion layer 112 is a square shape. The conductor 166 is provided around the periphery of the buried conductor 154. The conductor 166 is a square shape and the outside edge portion 166a of the conductor 166 is disposed further outside than an edge portion 114a on the first main face 101 of the high impurity concentration P-type diffusion layer 114 and disposed further outside than an edge portion 112a on the first main face 101 of the P-well diffusion layer 112. An inside edge portion 166b of the conductor 166 is also disposed further to the outside than the edge portion 112a on the first main face 101 of the P-well diffusion layer 112. The high impurity concentration N-type diffusion layer 102 is a square shape provided so as to surround the P-well diffusion layer 112 around the outside periphery of the P-well diffusion layer 112 and separated from the P-well diffusion layer 112. The buried conductor 152 is a square shape disposed within the high impurity concentration N-type diffusion layer 102.

A more specific example of a structure will now be explained. In this example the high impurity concentration P-type diffusion layer 114 is a square shape of 10 μm side, the P-well diffusion layer 112 is a square shape of 20 μm side, such that the separation distance is 5 μm between the edge portion 114a of the high impurity concentration P-type diffusion layer 114 on the first main face 101 and the edge portion 112a on the first main face 101 of the P-well diffusion layer 112. The separation distance is 50 μm between the edge portion 112a on the first main face 101 of the P-well diffusion layer 112 and an edge portion 102b on the first main face 101 of the high impurity concentration N-type diffusion layer 102. The separation distance is 1 μm between the inside edge portion 166b of the conductor 166 and the edge portion 112a on the first main face 101 of the P-well diffusion layer 112, and the separation distance is 3 μm between the outside edge portion 166a and the inside edge portion 166b of the conductor 166.

The insulating layer 130 is, for example, formed from a Tetraethoxysilane (TEOS) film, with a thickness of, for example, 10,000 Å. The concentration of impurities in the N-type substrate 100 is about $1.0 \times 10^{13}$ cm$^{-3}$, the concentration of impurities in the high impurity concentration N-type diffusion layer 102 is about $1.0 \times 10^{21}$ cm$^{-3}$, the concentration of impurities of the P-well diffusion layer 112 is about $1.0 \times 10^{17}$ cm$^{-3}$, and the concentration of impurities of the high impurity concentration P-type diffusion layer 114 is about $1.0 \times 10^{21}$ cm$^{-3}$.

The buried conductors 152, 154 and the conductors 162, 164 and 166 are formed from tungsten, and the electrode 120 is formed from aluminum.

The high impurity concentration P-type diffusion layer 114 is connected to a cathode 174 of a power source 170 and earth 180 through the conductors 154, 164, 192 and 193. The conductor 166 is connected to the cathode 174 of the power source 170 and earth 180 through the conductors 192 and 193. The high impurity concentration P-type diffusion layer 114 and the conductor 166 adopt the same electrical potential. The high impurity concentration N-type diffusion layer 102 is connected to an anode 172 of the power source 170 through the buried conductor 152, and the conductors 162 and 194. The electrode 120 provided on the back face 103 of the X-ray sensor 1 is connected to the anode 172 of the power source 170 through the conductor 194.

In order to raise detection sensitivity during X-ray irradiation in the X-ray sensor of the present exemplary embodiment, the entire N-type substrate 100 is depleted, by such a method as employing a low-impurity concentration high-resistance substrate for the N-type substrate 100 and applying a bias of several hundred volts to the N-type substrate 100. When depleting the N-type substrate 100, the high impurity concentration P-type diffusion layer 114 serving as the anode electrode of the diode formed in the low impurity concentration N-type substrate 100 is connected to earth 180, and the high impurity concentration N-type diffusion layer 102 serving as the cathode of the diode and the electrode 120 on the back face of the N-type substrate 100 are connected to the anode 172 of the power source 170, thereby applying a reverse voltage to the diode. In order to relax the electrical field concentration in the depleted layer spreading out to the anode electrode high impurity concentration P-type diffusion layer 114 side when this is being performed, the low impurity concentration P-well diffusion layer 112 is formed so as to cover the high impurity concentration P-type diffusion layer 114, raising the reverse voltage withstanding ability of the diode.

In the X-ray sensor of the present exemplary embodiment, the conductor 166 is also formed so as to surround the high impurity concentration P-type diffusion layer 114 and the P-well diffusion layer 112, and the conductor 166 is connected to earth 180. The conductor 166 thereby acts as a field plate, and the potential difference within the P-well diffusion layer 112 is made small by suppressing any rise in the electrical potential on the P-well diffusion layer 112 side.

Figure 15:
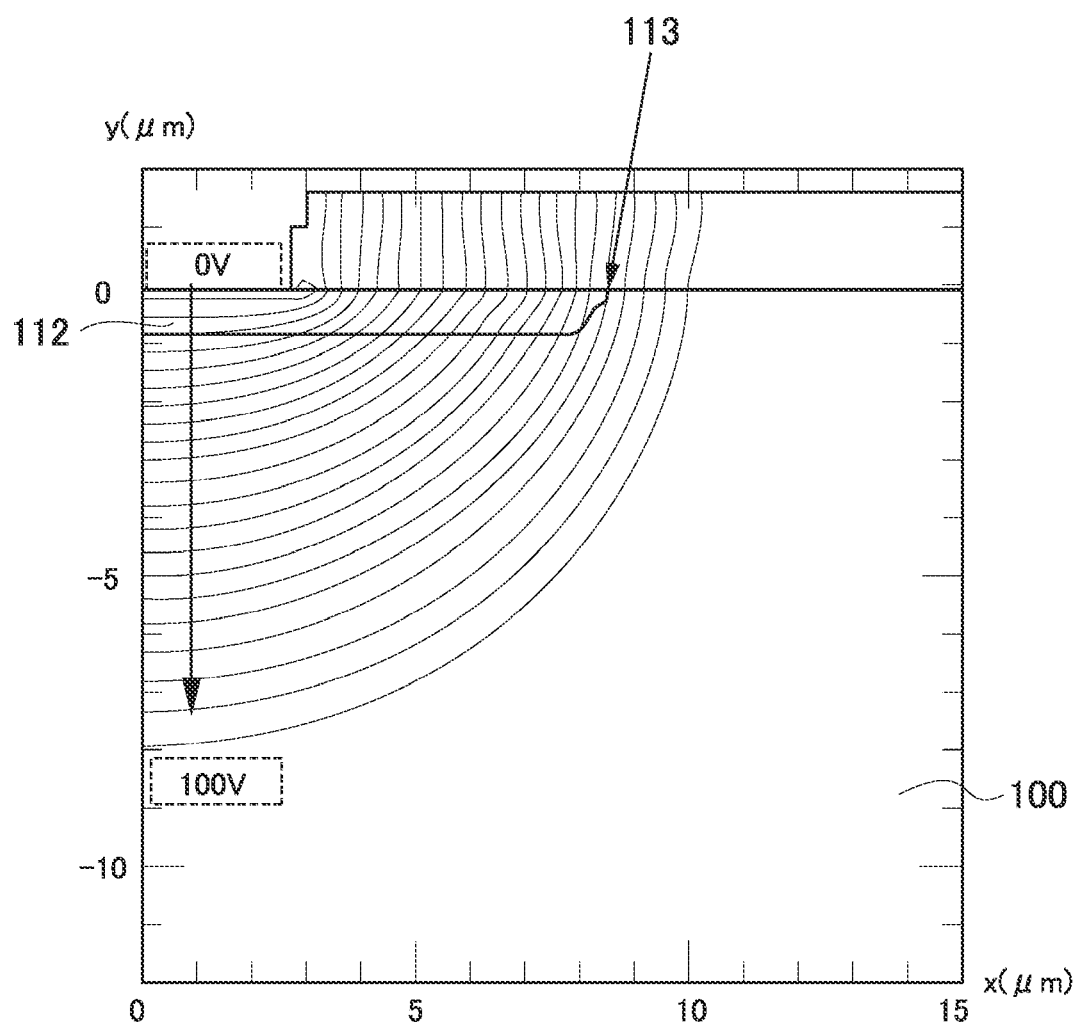
FIG. 15 is a graph illustrating an electrical potential distribution of the diode portion of a conventional X-ray sensor.
Figure 16:
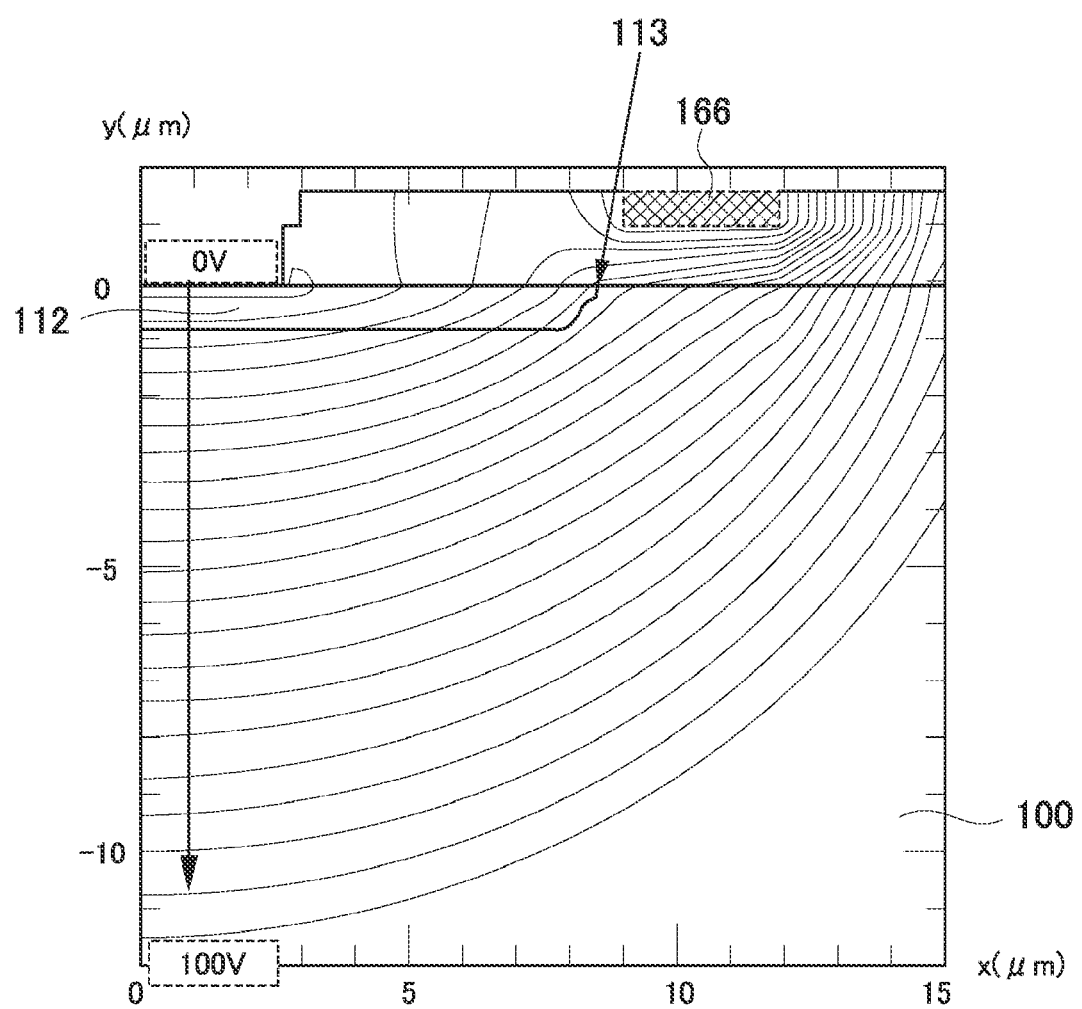
FIG. 16 is a graph illustrating an electrical potential distribution of the diode portion of an X-ray sensor of the first exemplary embodiment of the present invention.
Figure 17:
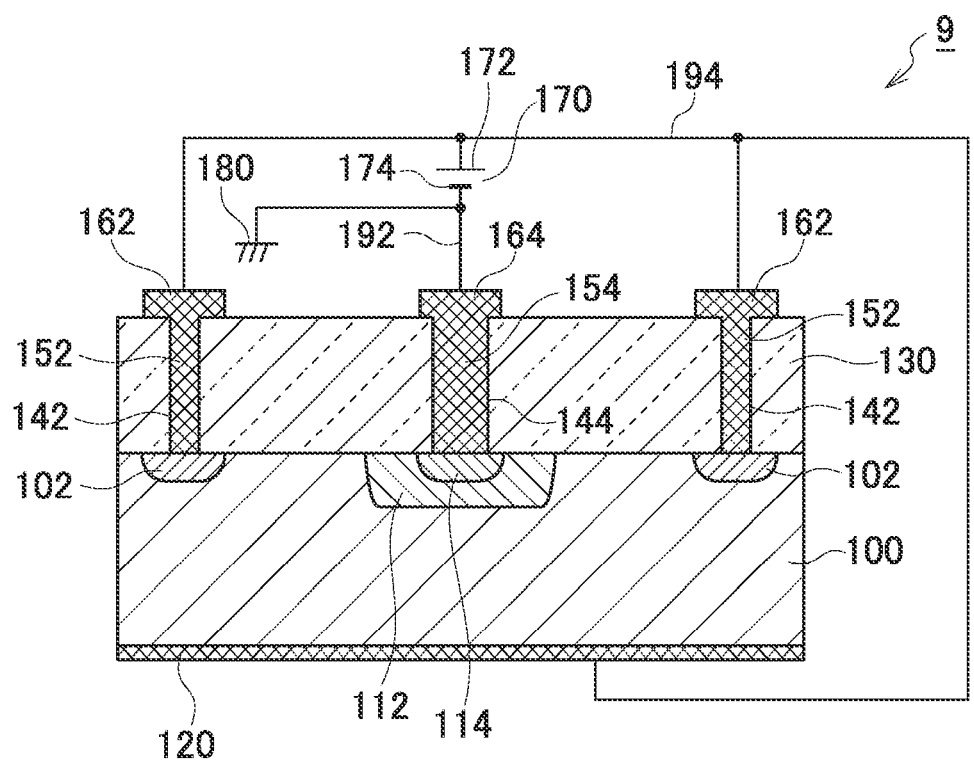
FIG. 17 is a schematic vertical cross-section for explaining a conventional X-ray sensor.

FIG. 16 is a graph illustrating the electrical potential distribution of the diode portion of the X-ray sensor of the first exemplary embodiment of the present invention. When a reverse voltage of 300V is applied to the diode portion of the X-ray sensor by the power source 170, the electrical potential in the vicinity of a PN junction 113 formed by the P-well diffusion layer 112 and the N-type substrate 100 is about 25V. In contrast, in the X-ray sensor 9 as shown in FIG. 17 in which a P-well diffusion layer 112 is provided but the conductor 166 is not provided, the electrical potential in the vicinity of the PN junction 113 formed by the P-well diffusion layer 112 and the N-type substrate 100 is about 80V, as shown in FIG. 15.

Accordingly, by providing the conductor 166, and by connecting the conductor 166 to the high impurity concentration P-type diffusion layer 114 using the conductor 192, the potential difference inside the P-well diffusion layer 112 can be made small by suppressing any rise in the electrical potential on the P-well diffusion layer 112 side. The outside edge portion 166a of the conductor 166 is preferably provided further to the outside than at least the edge portion 114a of the high impurity concentration P-type diffusion layer 114. The electrical field at the edge portion 114a of the high impurity concentration P-type diffusion layer 114 can thereby be relaxed and the reverse voltage withstanding ability of the diode can be raised. The outside edge portion 166a of the conductor 166 is more preferably provided further to the outside than the edge portion 112a of the P-well diffusion layer 112. The electrical potential in the vicinity of the PN junction 113 formed by the P-well diffusion layer 112 and the N-type substrate 100 can thereby be suppressed from rising, and the potential difference within the P-well diffusion layer 112 can be made small, thereby enabling the reverse voltage withstanding ability of the diode to be raised.

Explanation follows regarding a fabrication method of the X-ray sensor 1 of the first exemplary embodiment.

First the N-type substrate 100 is prepared and then the P-well diffusion layer 112 is formed by, for example, ion implantation in the first main face 101 of the N-type substrate 100. The high impurity concentration P-type diffusion layer 114 is then formed so as to have a higher concentration of impurities and be shallower than the P-well diffusion layer 112 by, for example, ion implantation within the P-well diffusion layer 112. The high impurity concentration N-type diffusion layer 102 is then formed with a higher concentration of impurities than the N-type substrate 100, such as by ion implantation in the first main face 101 of the N-type substrate 100.

The insulating layer 130 is then formed by TEOS on the first main face 101 of the N-type substrate 100. The through holes 142 and 144 are then formed in the insulating layer 130. The through holes 142 and 144 are then each filled with tungsten to form the buried conductors 152 and 154. The conductors 162, 164 and 166 are then selectively formed with tungsten on the insulating layer 130. The electrode 120 is subsequently formed with aluminum on the back face 103 of the N-type substrate 100.

Second Exemplary Embodiment

Figure 3:
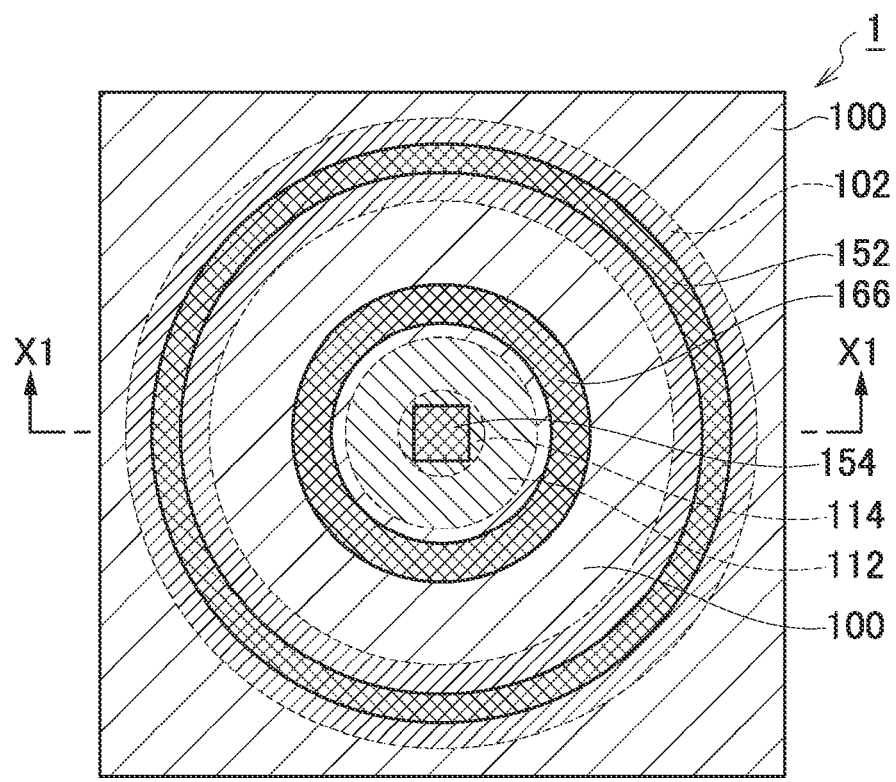
FIG. 3 is a schematic plan view for explaining an X-ray sensor of a second exemplary embodiment of the present invention.

In the first exemplary embodiment, portions such as the high impurity concentration P-type diffusion layer 114, the P-well diffusion layer 112, the conductor 166, the high impurity concentration N-type diffusion layer 102 and the buried conductor 152 are all square shaped. However, by shaping these portions so as to be polygonal with more apexes or, as shown in FIG. 3, with a circular shaped structure, an increase in the voltage withstanding ability is expected due to being able to further relax the electrical field inside the P-well diffusion layer 112. These configuration elements are similar to those of the first exemplary embodiment except in their shapes in plan view.

Third Exemplary Embodiment

Figure 4:
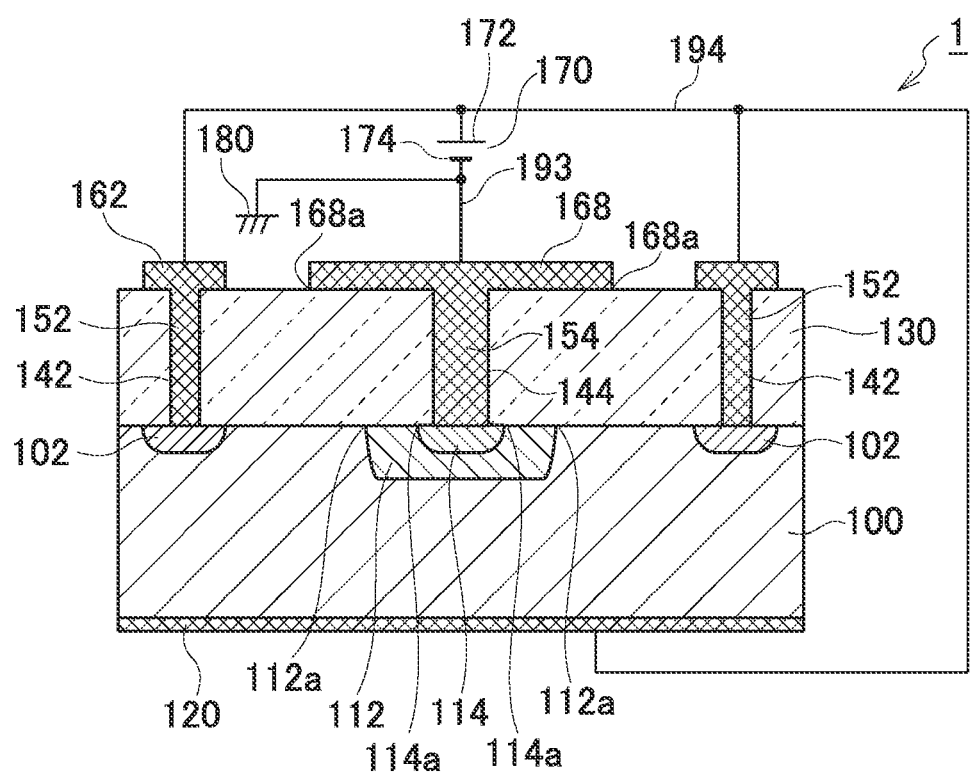
FIG. 4 is a schematic vertical cross-section for explaining an X-ray sensor of a third exemplary embodiment of the present invention.

In the first and the second exemplary embodiments, the conductor 166 and the conductor 164 connected to the high impurity concentration P-type diffusion layer 114 are configured as separate conductors separated from each other, and the conductor 166 and the conductor 164 are connected together by the conductor 192. However, as shown in FIG. 4, the third exemplary embodiment differs from the first and the second exemplary embodiments in that the conductor 166 and the conductor 164 are integrated together in the same wiring layer as a connected structure of a conductor 168. Other parts of the configuration are similar to those of the first and the second exemplary embodiments.

An outside edge portion 168a of the conductor 168 is preferably disposed further outside than the edge portion 112a of the P-well diffusion layer 112. The electrical potential in the vicinity of the PN junction formed by the P-well diffusion layer 112 and the N-type substrate 100 can thereby be suppressed from rising, and the potential difference within the P-well diffusion layer 112 can made small, enabling the reverse voltage withstanding ability of the diode to be raised.

Although the electrical field relaxing effect is reduced, a rise in the withstanding ability is expected even when the outside edge portion 168a of the conductor 168 is disposed further to the inside than the edge portion 112a of the P-well diffusion layer 112. In such cases the outside edge portion 168a of the conductor 168 is preferably disposed further to the outside than at least the edge portion 114a of the high impurity concentration P-type diffusion layer 114. The electrical field at the edge portion 114a of the high impurity concentration P-type diffusion layer 114 can thereby be relaxed, enabling the reverse voltage withstanding ability of the diode to be raised.

Fourth Exemplary Embodiment

Figure 5:
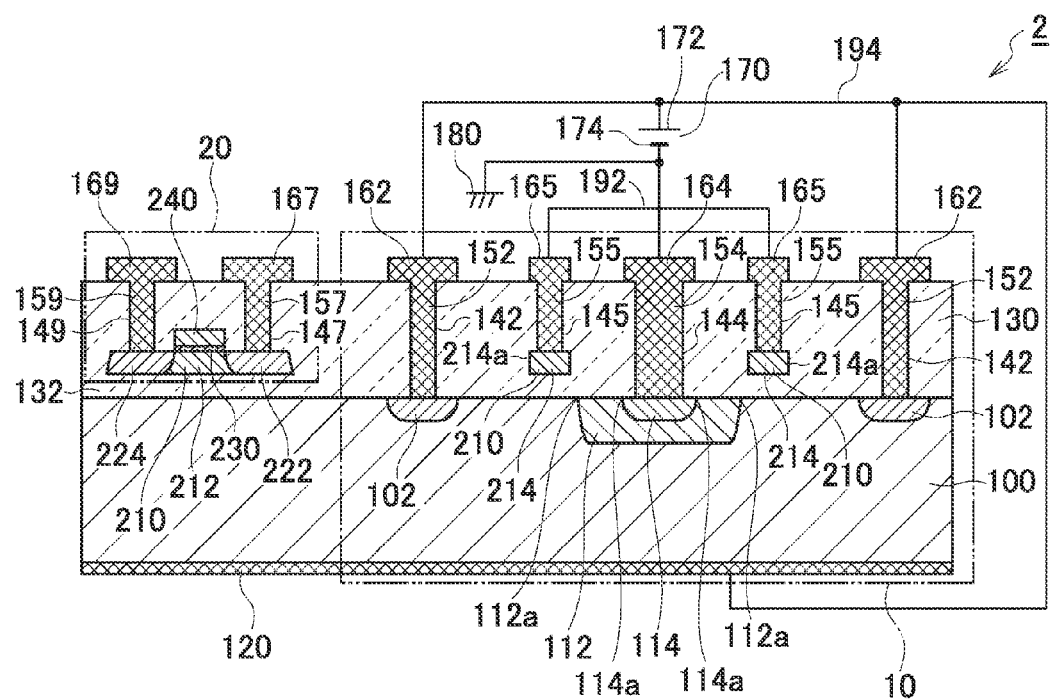
FIG. 5 is a schematic plan view for explaining an X-ray sensor of a fourth exemplary embodiment of the present invention.

In the first to the third exemplary embodiments, a diode is configured by utilizing an N-type substrate 100 with low impurity concentration and high resistance, however sometimes issues arise when forming elements such as MOS transistors for circuit operation within the same substrate 100. In order to address these issues, the fourth exemplary embodiment, as shown in FIG. 5, employs a Silicon On Insulator (SOI) substrate having, for example, a low impurity concentration high resistance N-type substrate 100 with a thickness of about 700 μm and specific resistance of 10 kΩ·cm at the bottom, an buried oxide layer 132 provided above the first main face 101 of the N-type substrate 100 with a thickness of, for example, about 2000 Å, and a P-type semiconductor layer 210 provided above the buried oxide layer 132 with a thickness of, for example, about 880 Å and a specific resistance of 10 Ω·cm.

Furthermore, configuration in the first and the second exemplary embodiments relaxes the electrical field by providing on the insulating layer 130 the conductor 166 and the conductor 164 connected to the high impurity concentration P-type diffusion layer 114, with the conductor 166 and the conductor 164 connected together by the conductor 192. In the fourth exemplary embodiment however a semiconductor layer 210 is formed in a similar shape to that of the conductor 166 in the first and the second exemplary embodiments. The electrical field is relaxed by providing: a semiconductor region 214 formed, for example, by ion implantation of an N-type impurity in the semiconductor layer 210 and set with a concentration of impurities of $1.0 \times 10^{21}$ cm$^{-3}$, and with a conductor 165 provided on an insulating layer 130 and connected to the semiconductor region 214 through a buried conductor 155 filled in a through hole 145 formed in the insulating layer 130, with the conductor 164 connected to the high impurity concentration P-type diffusion layer 114, and with the conductor 165 and the conductor 164 connected together by a conductor 192.

With respect to a diode 10 for detecting X-rays, the fourth exemplary embodiment differs from the first and the second exemplary embodiments in that whereas the conductor 166 is provided on the insulating layer 130 of the first and the second exemplary embodiments, the semiconductor region 214 is provided within the insulating layer 130 in the fourth exemplary embodiment. Other aspects are similar to those of the first and the second exemplary embodiments. The shapes shown in plan view in FIG. 2 and FIG. 3 similarly apply.

The relationships between an outside edge portion 214a of the semiconductor region 214 and the edge portion 112a of the P-well diffusion layer 112 and the edge portion 114a of the high impurity concentration P-type diffusion layer 114 are also similar to the corresponding relationships between the outside edge portion 166a of the conductor 166 and the edge portion 112a of the P-well diffusion layer 112 and the edge portion 114a of the high impurity concentration P-type diffusion layer 114. Namely, the outside edge portion 214a of the semiconductor region 214 is preferably further to the outside than at least the edge portion 114a of the high impurity concentration P-type diffusion layer 114. The electrical field at the edge portion 114a of the high impurity concentration P-type diffusion layer 114 can thereby be relaxed, and the reverse voltage withstanding ability of the diode can be raised. The outside edge portion 214a of the semiconductor region 214 is more preferably disposed further to the outside than the edge portion 112a of the P-well diffusion layer 112. The electrical potential in the vicinity of the PN junction 113 formed between the P-well diffusion layer 112 and the N-type substrate 100 can thereby be suppressed from rising, the potential difference within the P-well diffusion layer 112 can be made small, enabling the reverse voltage withstanding ability of the diode to be raised.

A MOS transistor 20 is provided in the semiconductor layer 210 at a region separated from the diode. The MOS transistor 20 is configured including a semiconductor region 212 separated from the diode 10 of the semiconductor layer 210, a gate insulation film 230 provided on the semiconductor region 212, a gate electrode 240 provided on the gate insulation film 230, and a source 222 and a drain 224 provided at the semiconductor region 212 on both sides of the gate electrode 240. The source 222 is connected to a conductor 167 provided on the insulating layer 130 through a buried conductor 157 filled in a through hole 147 formed in the insulating layer 130. The drain 224 is connected to a conductor 169 provided on the insulating layer 130 through a buried conductor 159 filled in a through hole 149 provided in the insulating layer 130.

As shown in FIG. 5, an X-ray sensor including a peripheral circuit is configurable on a single wafer by using the semiconductor layer 210 above the buried oxide layer 132 as a high impurity concentration low resistance semiconductor layer used for forming active elements, such as a MOS transistor 20 employed as an operation circuit, and by using an N-type substrate below the buried oxide layer 132 as a low impurity concentration high resistance substrate employed for forming the diode 10.

In order to deplete the N-type substrate 100, the high impurity concentration P-type diffusion layer 114 serving as the anode electrode of the diode formed in the low impurity concentration N-type substrate 100 is connected to earth 180, and the high impurity concentration N-type diffusion layer 102 serving as the cathode of the diode is connected to the electrode 120 on the back face of the N-type substrate 100 and to the anode 172 of the power source 170, thereby applying a reverse voltage to the diode. The low impurity concentration P-well diffusion layer 112 is formed so as to cover the high impurity concentration P-type diffusion layer 114 in order to relax electrical field concentration in the depleted layer spreading out from the anode electrode high impurity concentration P-type diffusion layer 114 side, thereby raising the reverse voltage withstanding ability of the diode. Furthermore, the semiconductor region 214 is formed so as to surround the high impurity concentration P-type diffusion layer 114 and the low impurity concentration P-well diffusion layer 112, and the semiconductor region 214 is connected to earth 180. The semiconductor region 214 accordingly acts as a field plate, and the potential difference within the P-well diffusion layer 112 is made small by suppressing any rise in electrical potential on the P-well diffusion layer 112 side.

Consequently, a reduction in cost and shrinking of chip size is enabled by configuring an X-ray sensor that includes a peripheral circuit on a single wafer according to the fourth exemplary embodiment. Furthermore, by forming the semiconductor region 214 and setting the high impurity concentration P-type diffusion layer 114 serving as the anode electrode of the diode to the same electrical potential, the semiconductor region 214 acts as a field plate when a reverse voltage is applied to the diode. The potential difference within the P-well diffusion layer 112 is accordingly made small, thereby enabling the electrical field within the P-well diffusion layer 112 to be relaxed and enabling the reverse voltage withstanding ability to be raised.

Explanation follows regarding a fabrication method of the X-ray sensor 2 of the fourth exemplary embodiment.

Figure 6:
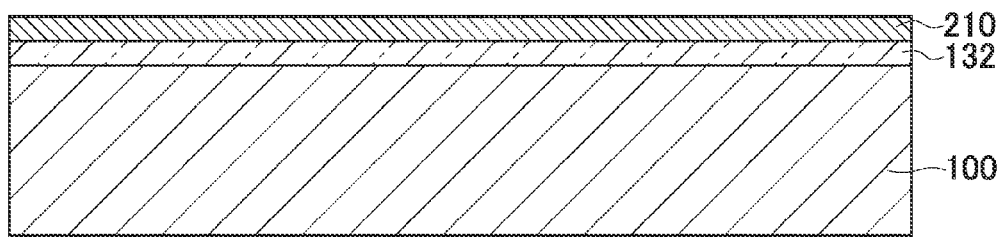
FIG. 6 is a schematic vertical cross-section for explaining a fabrication method of an X-ray sensor of the fourth exemplary embodiment of the present invention.

First, as shown in FIG. 6, an SOI substrate is prepared with a stacked sandwich structure of a semiconductor layer 210 above a buried oxide layer 132 and an N-type substrate 100 below the buried oxide layer 132. In the fourth exemplary embodiment, for example, the N-type substrate 100 has a thickness of about 700 μm and a specific resistance of 10 kΩ·cm, a SiO$_2$ oxide layer of about 2000 Å thickness is employed as the buried oxide layer 132, and the semiconductor layer 210 is P-type, with a thickness of about 880 Å and specific resistance of 10 Ω·cm.

Figure 7:
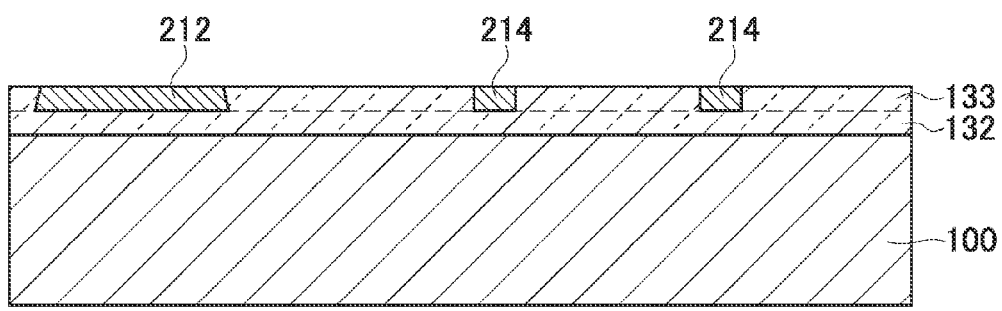
FIG. 7 is a schematic vertical cross-section for explaining a fabrication method of an X-ray sensor of the fourth exemplary embodiment of the present invention.

Then, as shown in FIG. 7, a nitride film (Si$_3$N$_4$) (not shown in the drawings) is selectively formed by a method such as CVD on the top face of the semiconductor layer 210. The nitride film is masked and a field oxidized film 133 is formed using a Local Oxidation of Silicon (LOCOS) method so as to separate the semiconductor layer 210 into the semiconductor regions 212 and 214.

Figure 8:
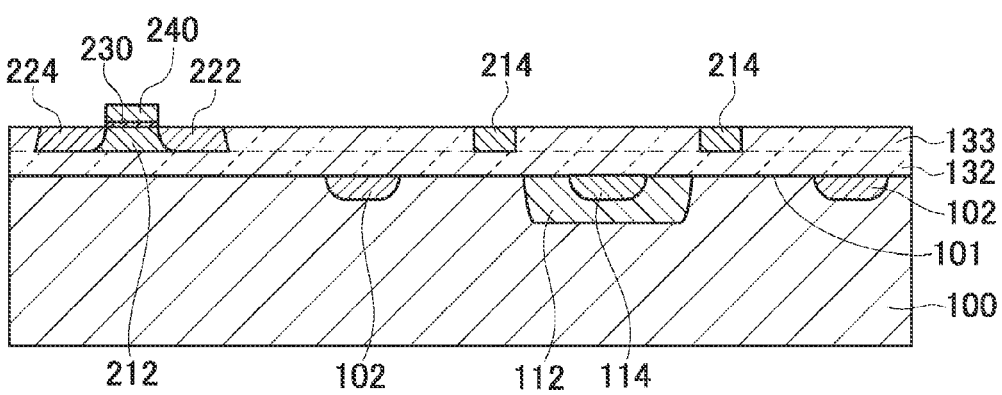
FIG. 8 is a schematic vertical cross-section for explaining a fabrication method of an X-ray sensor of the fourth exemplary embodiment of the present invention.

Then, as shown in FIG. 8, masking is performed using a selectively formed resist (not shown in the drawings), and the P-well diffusion layer 112 is formed by a method such as ion implantation in the first main face 101 of the N-type substrate 100. The high impurity concentration P-type diffusion layer 114 is then formed such as by ion implantation in the P-well diffusion layer 112 at a depth shallower and a concentration of impurities higher than the P-well diffusion layer 112. The high impurity concentration N-type diffusion layer 102 is then formed with a higher concentration of impurities than the N-type substrate 100 such as by ion implantation in the first main face 101 of the N-type substrate 100.

The gate insulation film 230 is then formed on the semiconductor region 212, the gate electrode 240 is formed on the gate insulation film 230, the gate electrode 240 is masked, and N-type impurities are ion implanted using the gate electrode 240 as a mask so as to form the source 222 and the drain 224 in the semiconductor region 212 on either side of the gate electrode 240. The semiconductor region 214 is also ion implanted with an N-type impurity to give an concentration of impurities of about $1.0 \times 10^{21}$ cm$^{-3}$.

Figure 9:
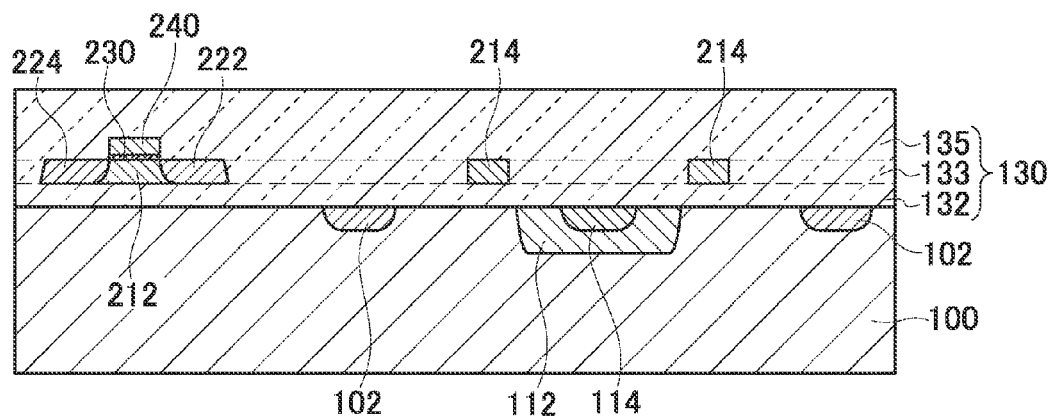
FIG. 9 is a schematic vertical cross-section for explaining a fabrication method of an X-ray sensor of the fourth exemplary embodiment of the present invention.

Then, as shown in FIG. 9, a TEOS is employed to form an insulation layer 135 over the entire surface. The insulating layer 130 is formed by the buried oxide layer 132, the field oxidized film 133 and the insulation layer 135.

Figure 10:
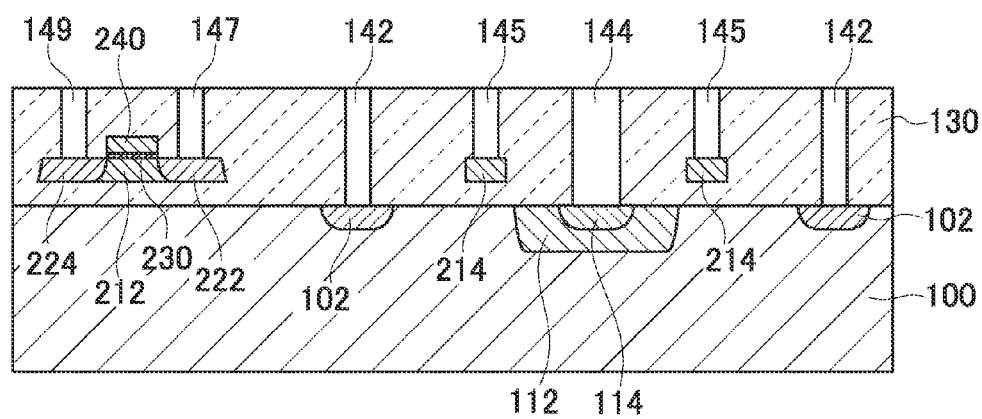
FIG. 10 is a schematic vertical cross-section for explaining a fabrication method of an X-ray sensor of the fourth exemplary embodiment of the present invention.

Then, as shown in FIG. 10, the through holes 142, 144, 145, 147 and 149 are formed in the insulating layer 130.

Figure 11:
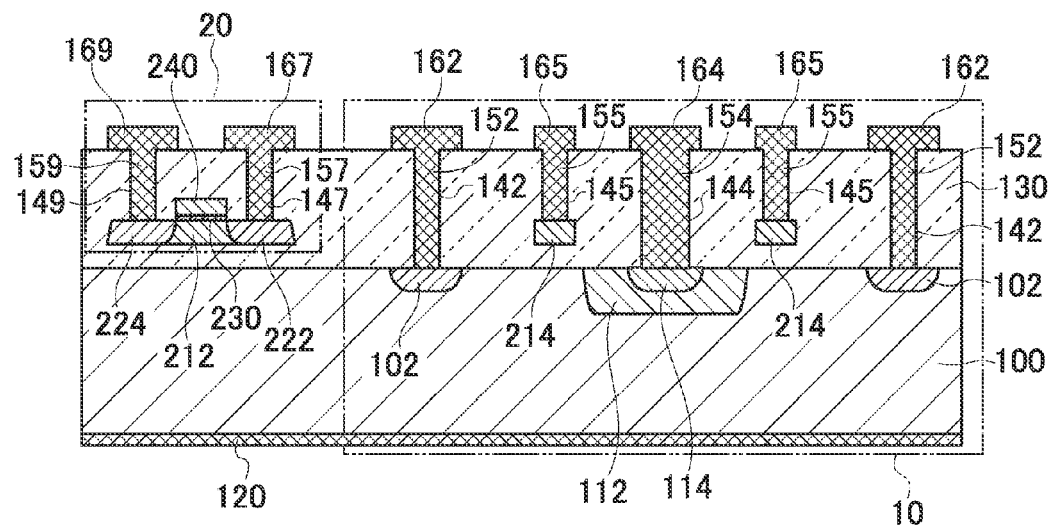
FIG. 11 is a schematic vertical cross-section for explaining a fabrication method of an X-ray sensor of the fourth exemplary embodiment of the present invention.
Figure 12:
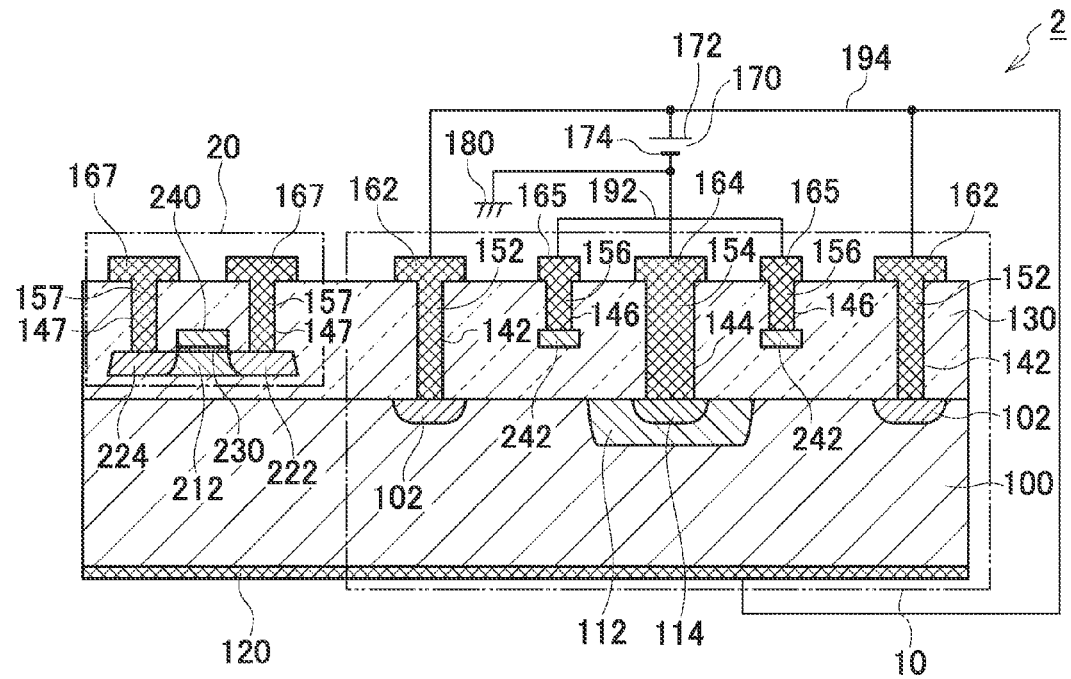
FIG. 12 is a schematic vertical cross-section for explaining an X-ray sensor of a fifth exemplary embodiment of the present invention.
Figure 13:
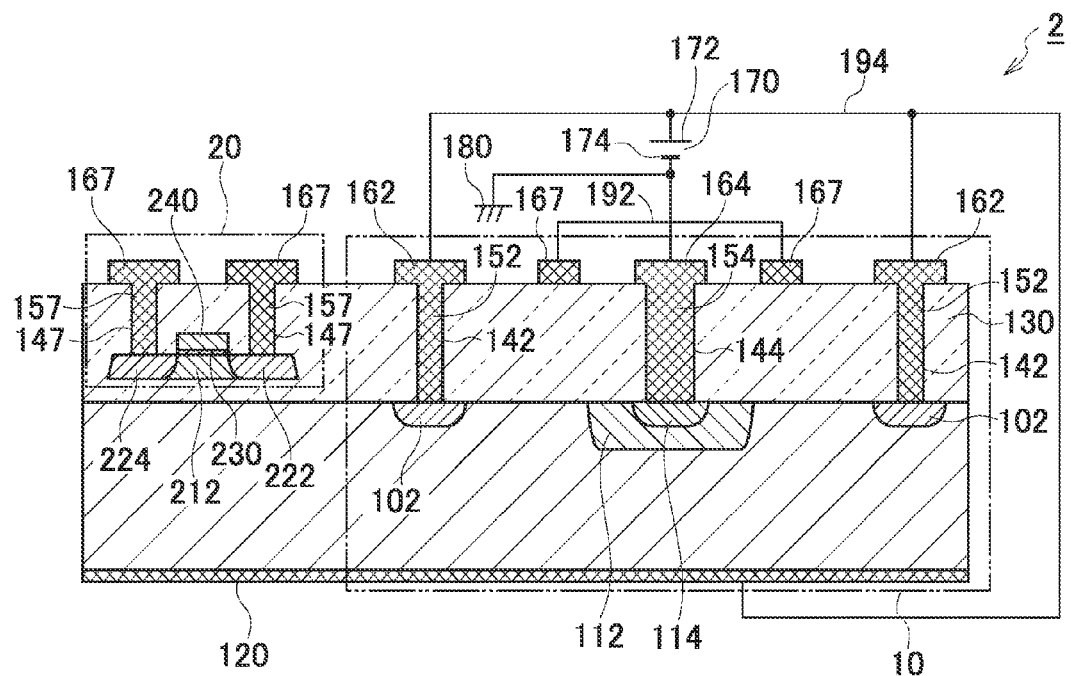
FIG. 13 is a schematic vertical cross-section for explaining an X-ray sensor of a sixth exemplary embodiment of the present invention.

Tungsten is then filled into the through holes 142, 144, 145, 147 and 149 to form buried conductors 152, 154, 155, 157 and 159, as shown in FIG. 11. The conductors 162, 164, 165, 167 and 169 are then selectively formed with tungsten on the insulating layer 130. The electrode 120 is subsequently formed with aluminum on the back face 103 of the N-type substrate 100.

Fifth Exemplary Embodiment

In the fourth exemplary embodiment, the semiconductor layer 210 is formed through ion implantation of N-type impurities with the semiconductor region 214 set with a concentration of impurities to a concentration of $1.0 \times 10^{21}$ cm$^{-3}$. The electric field is relaxed by providing the conductor 165 on the insulating layer 130 and connected to the semiconductor region 214 through the buried conductor 155 filled in the through hole 145 provided in the insulating layer 130, and the conductor 164 connected to the high concentration P-type diffusion layer 114, with the conductor 165 and the conductor 164 connected together by the conductor 192. However, the fifth exemplary embodiment differs from the fourth exemplary embodiment in that a conductor 242 is formed in the same layer as that of the gate electrode 240 of the MOS transistor 20 and with a similar shape to that of the semiconductor region 214 of the fourth exemplary embodiment. The electric field is relaxed by providing the conductor 165 on the insulating layer 130 and connected to the conductor 242 through the buried conductor 156 filled in the through hole 146 provided in the insulating layer 130, and the conductor 164 connected to the high impurity concentration P-type diffusion layer 114, with the conductor 165 and the conductor 164 connected together by the conductor 192. Other parts of the configuration are similar to those of the fourth exemplary embodiment.

Sixth Exemplary Embodiment

In the fourth exemplary embodiment, the semiconductor layer 210 is formed through ion implantation of N-type impurities with the semiconductor region 214 set with a concentration of impurities to a concentration of $1.0 \times 10^{21}$ cm$^{-3}$. The electric field is relaxed by providing the conductor 165 on the insulating layer 130 and connected to the semiconductor region 214 through the buried conductor 155 filled in the through hole 145 provided in the insulating layer 130, and the conductor 164 connected to the high impurity concentration P-type diffusion layer 114, with the conductor 165 and the conductor 164 connected together by the conductor 192. However, the sixth exemplary embodiment differs from the fourth exemplary embodiment in that the electric field is relaxed by forming a conductor 167 on the insulating layer 130 with a similar shape to that of the semiconductor region 214 of the fourth exemplary embodiment, and using the conductor 192 to connect the conductor 167 to the conductor 164 that is connected to the high impurity concentration P-type diffusion layer 114. Other parts of the configuration are similar to those of the fourth exemplary embodiment.

In the sixth exemplary embodiment, the conductor 167 and the conductor 164 connected to the high impurity concentration P-type diffusion layer 114 are configured as separate components separated from each other, with the conductor 167 and the conductor 164 connected together by the conductor 192. However, similarly to in the third exemplary embodiment, configuration may be made with the conductor 167 and the conductor 164 integrated together in the same wiring layer and a conductor formed with this connected structure.

Figure 14:
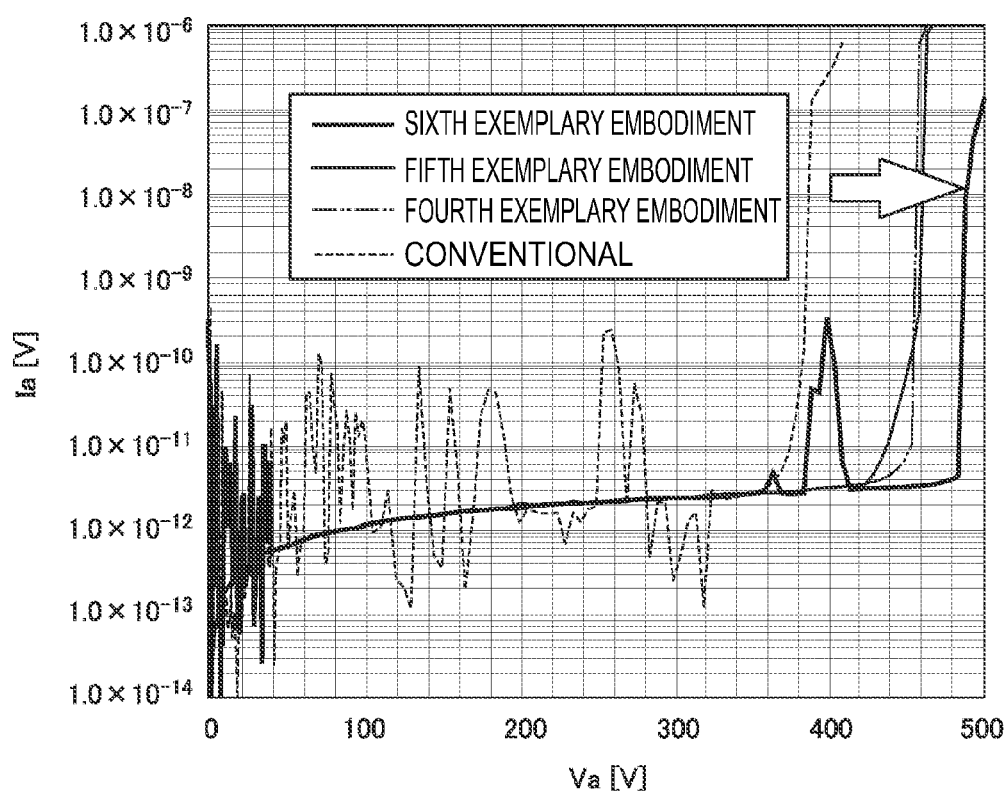
FIG. 14 is a graph illustrating withstand voltages when a reverse voltage is applied to a diode portion of an X-ray sensor of the fourth, fifth and sixth exemplary embodiments of the present invention and in a conventional case.

FIG. 14 is a graph showing withstand voltages when a reverse voltage is applied to the diode 10 of an X-ray sensor of the fourth, fifth and sixth exemplary embodiments and in a conventional case. The conventional X-ray sensor has the diode 10 with the structure illustrated in FIG. 17. In is clear from FIG. 14 that withstand voltage when a reverse voltage is applied is raised for the fourth, fifth and sixth exemplary embodiments in comparison to the conventional X-ray sensor.

Configurations may be structured in each of the above exemplary embodiments with P-type in place of N-type and with N-type in place of P-type.

While the present invention has been explained through various exemplary embodiments the present invention is not limited to such exemplary embodiments. The scope of the present invention is accordingly limited by the scope of the following claims.

What is claimed is:

1. A semiconductor device comprising:
 a first semiconductor layer of a first conductivity type;
 an insulation layer provided on a first main face of the first semiconductor layer;

a second semiconductor layer provided in the insulation layer;

an active element provided in the second semiconductor layer;

a first semiconductor region provided on the first main face of the first semiconductor layer and having a second conductivity type opposite to the first conductivity type;

a second semiconductor region provided within the first semiconductor region and having the second conductivity type with a higher concentration of impurities than the first semiconductor region; the first semiconductor region covering a portion of the second semiconductor region such that the second semiconductor region is not in contact with the first semiconductor layer;

a first conductor provided in a through hole provided in the insulation layer and connected to the second semiconductor region;

a second conductor configured from the second semiconductor layer and provided either above the insulation layer or within the insulation layer with at least a part of the insulating layer interposed between the second conductor and the first semiconductor layer such that the second conductor is located away from the first semiconductor layer, the second conductor being provided so as to surround the first conductor such that an outside edge portion of the second conductor is disposed further outside than the second semiconductor region when viewed from a direction perpendicular to the first main face;

a third conductor provided so as to connect together the first conductor and the second conductor; and a fourth conductor provided so as to be electrically connected to the first semiconductor layer.

2. The semiconductor device of claim 1, wherein the outside edge portion of the second conductor is further outside than the first semiconductor region when viewed from the direction perpendicular to the first main face.

3. The semiconductor device of claim 1, wherein the first conductor and the second conductor are connected together so as to adopt the same electrical potential.

4. The semiconductor device of claim 1, wherein the fourth conductor is electrically connected to the first semiconductor layer at the first main face of the first semiconductor layer and at a main face on the opposite side to the first main face.

5. The semiconductor device of claim 1 wherein the first semiconductor layer and the first semiconductor region are reverse bias connected.

* * * * *